United States Patent [19]

Prentice

[11] Patent Number: 4,472,648
[45] Date of Patent: Sep. 18, 1984

[54] TRANSISTOR CIRCUIT FOR REDUCING GATE LEAKAGE CURRENT IN A JFET

[75] Inventor: John S. Prentice, Palm Bay, Fla.

[73] Assignee: Harris Corporation, Melbourne, Fla.

[21] Appl. No.: 296,192

[22] Filed: Aug. 25, 1981

[51] Int. Cl.³ ............... H03K 17/16; H03K 17/687; H03K 19/094; H03K 19/003
[52] U.S. Cl. .................. 307/571; 307/304; 307/491; 307/497; 307/501; 323/316; 330/253; 330/256; 330/257; 330/277; 330/288
[58] Field of Search .......... 307/491, 495, 497, 499, 307/501, 570, 571, 297, 304, 572, 450; 330/288, 257, 299, 300, 277, 253, 289, 256; 323/312, 315, 316, 317

[56] References Cited

U.S. PATENT DOCUMENTS

| | | | |
|---|---|---|---|
| 2,954,486 | 9/1960 | Doucette et al. | 357/22 X |
| 4,068,254 | 1/1978 | Erdi | 330/288 |
| 4,126,830 | 11/1978 | Schade, Jr. | 307/304 X |
| 4,207,537 | 1/1980 | Cave et al. | 330/253 |
| 4,216,394 | 8/1980 | Leidich | 307/296 R |

OTHER PUBLICATIONS

Wen, "Design and Operation of a Floating Gate Amplifier", IEEE Journal of Solid State Circuits, vol. SC9, No. 6, pp. 410–414, Dec. 1974.
Watson, "Testing Gate-Leakage Current in FETs", Electronic Engineering, pp. 53–55, Jun. 1972.
Garverick et al., "An MOS Chip for Surface Impedance Measurement and Moisture Monitoring", International Electron Devices Meeting, Tech. Dig., pp. 685–688, Dec. 1980.

Primary Examiner—Stanley D. Miller
Assistant Examiner—David R. Bertelson
Attorney, Agent, or Firm—Barnes & Thornburg

[57] ABSTRACT

A transistor circuit is provided comprising a primary JFET whose gate leakage current is required to be minimized, and a reference current generator means connected to the source of the primary JFET for deriving a drain-to-source current to be applied to the source of the primary JFET. The drain-to-source current has a value which forces the gate leakage current to be minimized. The reference current generator means comprises either a trimmed adjustable current source, a current source JFET, or a scaled reference source. These current devices are connected to the source of the primary JFET either directly or through a current mirror means to minimize the gate leakage current of the primary JFET.

12 Claims, 6 Drawing Figures

FIG.1
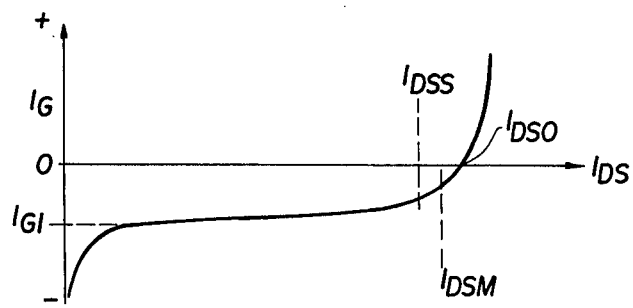
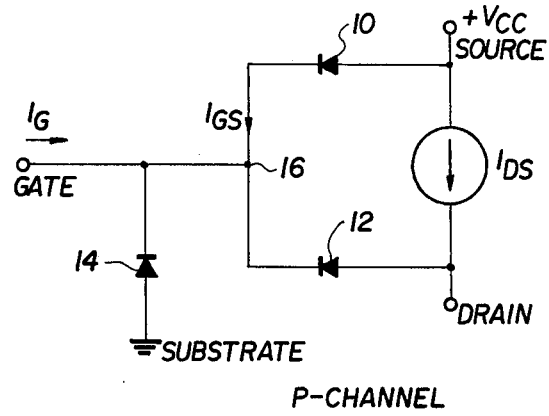
FIG.2
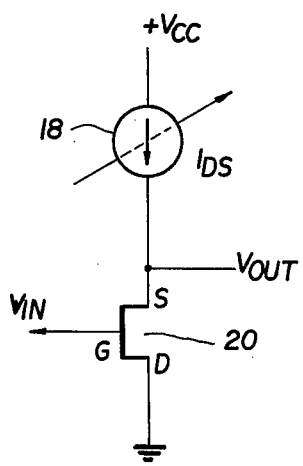
FIG.3
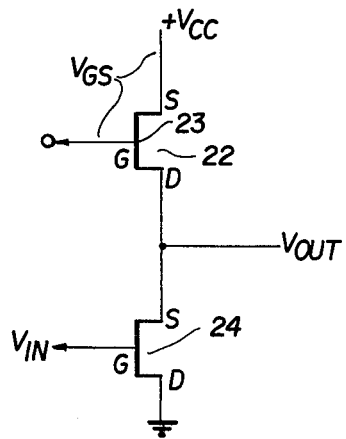
FIG.4

TRANSISTOR CIRCUIT FOR REDUCING GATE LEAKAGE CURRENT IN A JFET

BACKGROUND OF THE INVENTION

This invention relates to transistor circuits, and particularly to a circuit for reducing the gate leakage current of a junction field effect transistor, or JFET.

A pair of matched junction field effect transistors are often advantageously utilized as the input stage of an operational amplifier since two ideal requirements for such an amplifier are infinite input impedance and zero input current. It is well known that field effect transistors have an extremely high input impedance and thus are practical for operational amplifier use. Morever, in an ideal JFET, there should normally be no input, or gate current since the diode junctions which comprise the transistor are reverse-biased. In practice, however, reverse-biased pn junctions have a small leakage current, and therefore a finite input current will exist at the gate input of the JFET. This gate leakage current is relatively small at room temperature, but can become quite large at higher ambient temperatures. A high gate leakage current is undesirable when viewed in conjunction with the need for zero input current in the ideal operational amplifier.

It is known in the prior art to provide a cancellation circuit to compensate for gate leakage current in a JFET. Such a circuit is described in U.S. Pat. No. 4,068,254 to Erdi. In this patent, means are provided for establishing a reference current, the magnitude of which is a function of the JFET's gate leakage current over a given operating range. A proportional current mirror tracks the reference current to yield a current which is substantially equal in magnitude to the gate leakage current. This current is applied to the gate of the JFET to effectively cancel the JFET input current that would otherwise be required to supply the gate leakage current. This circuit has proven satisfactory but does not provide low enough bias currents for precision operational amplifier applications.

SUMMARY OF THE INVENTION

It is therefore an object of the instant invention to provide a novel transistor circuit for reducing the gate leakage current of a JFET such that the transistor can be effectively utilized in the input stage of a precision operational amplifier.

It is a further object of the instant invention to provide a transistor circuit for use in an operational amplifier wherein the input current to the amplifier is minimized and substantially insensitive to temperature.

It is yet another object of this invention to provide a transistor circuit for reducing the gate leakage current of a JFET which is relatively simple in design and inexpensive to manufacture.

These and other objects of the invention are accomplished by providing a transistor circuit comprising a primary JFET whose gate leakage current is required to be minimized, this primary JFET having a gate, a drain, and a source; and a reference current generator means connected to the source of the primary JFET for deriving a drain-to-source current to be applied to the source of the primary JFET. The drain-to-source current has a value which forces the gate leakage current of the primary JFET to be minimized.

In one embodiment, the reference current generator means comprises an adjustable current source in series with the source of the primary JFET. This adjustable current source is trimmed to the value of drain-to-source current which forces the gate leakage current of the primary JFET to be minimized.

In a second embodiment, the reference current generator means comprises a current source JFET having a gate, a drain and a source, the drain of the current source JFET being connected to the source of the primary JFET. The primary JFET and the current source JFET are substantially identical transistors. The gate of the current source JFET is left floating such that the gate-to-source junction of the current source JFET is forward-biased. The current source JFET derives the drain-to-source current to be applied to the source of the primary JFET to reduce the gate leakage current thereof.

In another embodiment of the instant invention, the source of the current source JFET is connected to the source of the primary JFET by a current mirror means. Again, the current source JFET and the primary JFET are substantially identical transistors and the gate of the current source JFET is left floating such that the gate-source junction of the current source JFET is forward-biased. The drain-to-source current derived by the current source JFET is applied to the source of the primary JFET by the current mirror means to minimize the gate leakage current thereof.

In another embodiment, the reference current generator means comprises a scaled reference source comprising a second JFET and a current scaler means. The source of the second JFET is connected to the source of the primary JFET through the current scaler means. The gate of the second JFET is shorted to the source thereof such that the gate-to-source voltage of the second JFET equals zero. The current scaler means includes a means for multiplying the current through the second JFET by a scale factor and applying the resulting scaled current to the source of the primary JFET to minimize the gate leakage current thereof. The current scaler means is a current mirror means which includes a pair of resistors which are ratioed to a value equal to the scale factor.

BRIEF DESCRIPTION OF THE DRAWINGS

FIG. 1 is an experimental plot of JFET gate leakage current $I_G$ versus JFET drain-to-source current $I_{DS}$.

FIG. 2 is a model of a p-channel JFET showing the pn junctions which comprise the transistor.

FIG. 3 is a simple embodiment of the instant invention showing the use of an adjustable current source to minimize the gate leakage current of a primary JFET.

FIG. 4 is another embodiment of the instant invention showing the use of a current source JFET to minimize the gate leakage current of a primary JFET.

DESCRIPTION OF THE PREFERRED EMBODIMENT

Figure 5:
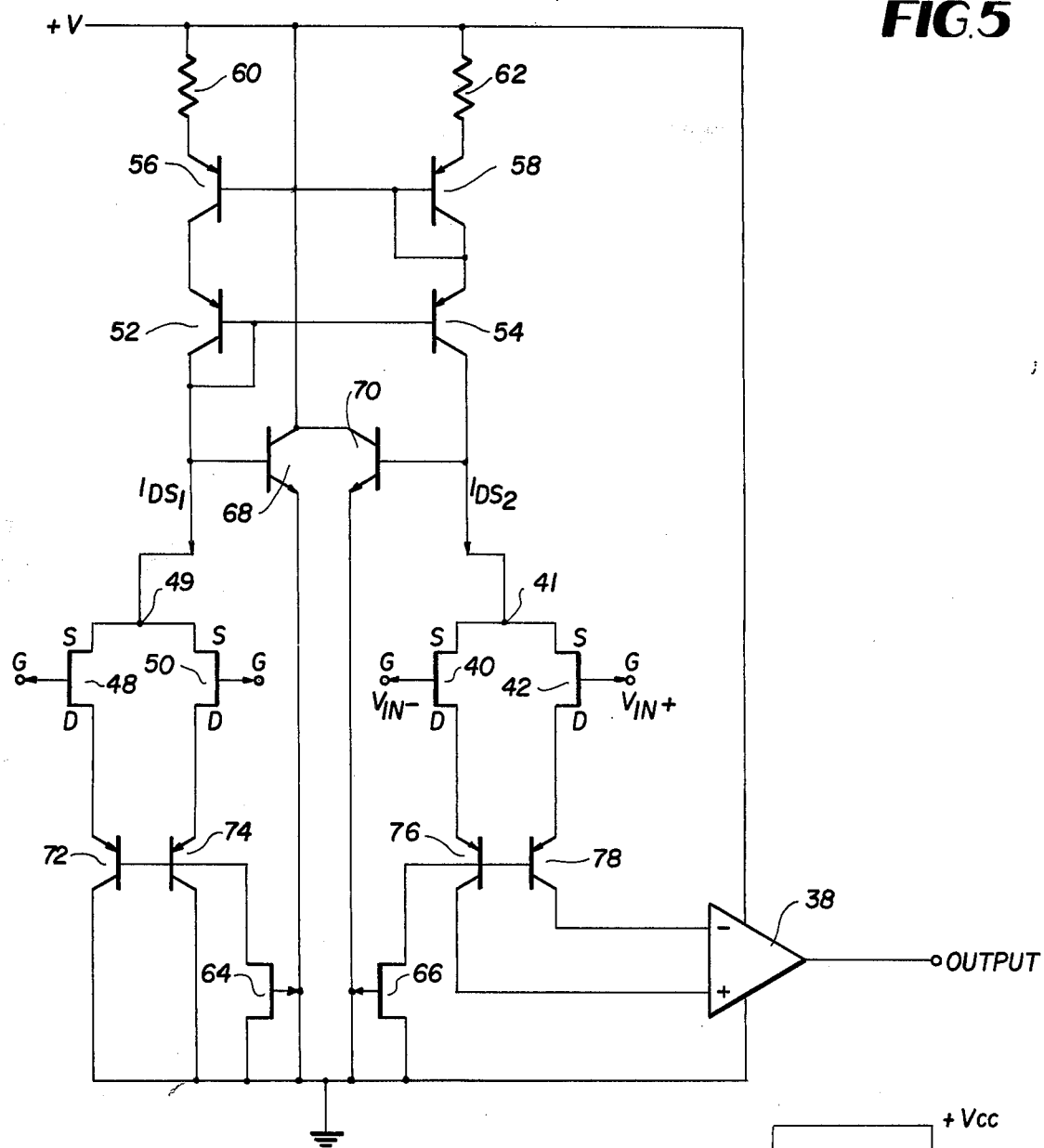
FIG. 5 is another embodiment of the invention in conjunction with an operational amplifier.

The conceptual foundation of the instant invention is best described with respect to the experimental plot of JFET gate leakage current $I_G$ versus JFET drain-to-source current $I_{DS}$, seen in FIG. 1. In particular, it can be seen that the value of the gate leakage current $I_G$ varies as a nonlinear function of the drain-source current. In a JFET, a pn junction is formed at the interface of the gate and the source-to-drain layer. When this junction is reverse-biased, current flow through the channel between the source and drain is controlled by the magnitude of reverse-bias voltage, which if sufficient can cut off the flow of current $I_{DS}$ through the channel. The voltage which cuts off the channel is the pinch-off voltage. Referring now to FIG. 1, when $I_{DS}$ is at or near zero, which indicates that the channel is at the pinch-off voltage, the gate leakage current $I_G$ is negative and has a large magnitude due to carrier generation in the depletion region of the pn junction. As $I_{DS}$ increases, the gate leakage current $I_G$ decreases to a finite value $I_{G1}$ and remains relatively constant until $I_{DS}$ reaches the point $I_{DSS}$, which is the value of $I_{DS}$ when the gate-to-source voltage $V_{GS}$ is zero. As $I_{DS}$ increases beyond $I_{DSS}$, the gate leakage current goes to zero at point $I_{DSO}$, then changes direction and increases. This increase occurs because the gate to source pn junction becomes sufficiently forward-biased to conduct and therefore the input resistance of the JFET decreases sharply, allowing large current flow. FIG. 1 indicates that the gate leakage current $I_G$ can be minimized as a function of the drain-to-source current $I_{DS}$. Specifically, a finite value $I_{DSM}$ of $I_{DS}$, which is greater than $I_{DSS}$, will cause the gate leakage current to be minimized.

The plot of the gate leakage current $I_G$ seen in FIG. 1 can be further explained by examining the model of a p-channel JFET, as shown in FIG. 2. The JFET, as discussed above, is a voltage controlled current source since variation of the gate voltage varies the drain-to-source current $I_{DS}$. Referring now to FIG. 2, it is seen that the p-channel JFET actually comprises three pn junctions. More specifically, the diode 10 represents the gate-to-source junction, the diode 12 represents the gate-to-drain junction, while the diode 14 represents the gate-to-substrate junction. This latter junction exists due to the fact that JFETs are generally manufactured by planar technology in which all diffusions and contacts are made from one side of a substrate. This manufacturing process is well known in the prior art and forms no part of the instant invention.

The diodes 10, 12 and 14 seen in FIG. 2 are normally reverse-biased. Therefore, a finite leakage current exists across each pn junction forming the individual diodes. The magnitude and direction of the individual leakage currents depend generally upon several factors including the applied voltage across the junction, the ambient temperature, the area of the junctions, as well as the concentrations of the p and n materials. The sum of the individual leakage currents of diodes 10, 12 and 14 is defined as the gate leakage current $I_G$, which is plotted versus drain-to-source current $I_{DS}$ in FIG. 1. Note that the gate leakage current exists whether or not an input signal is applied to the gate, as long as one of the diodes 10, 12 or 14 is reverse-biased.

It should be noted that although FIG. 2 describes a p-channel JFET, this type of structure is not meant to be limiting. It is envisioned that the present invention be utilized for reducing gate leakage current in an n-channel JFET as well.

As discussed above with respect to FIG. 1, when the drain-to-source current $I_{DS}$ reaches a certain value $I_{DSM}$, the gate leakage current $I_G$ can be minimized. The instant invention generally provides a circuit for controlling the drain-to-source current $I_{DS}$ to achieve this minimization. With reference to FIG. 2, when diode 10 becomes forward biased, $I_{DS}$ is greater in magnitude than $I_{DSS}$, which is the value of the drain-to-source current $I_{DS}$ when the gate-to-source voltage is zero. Therefore, when the gate-to-source voltage goes negative, diode 10 is forward-biased and a current $I_{GS}$ flows into node 16 of FIG. 2 from the source terminal. This current is summed at node 16 with the individual leakage currents of diodes 12 and 14, which remain reverse-biased. The current $I_{GS}$ is a forward current due to the forward bias of diode 10, and can be properly selected to effectively cancel the individual leakage currents of diodes 12 and 14 when the three currents are summed at node 16. Specifically, once diode 10 is forward-biased, $I_{GS}$ can be made equal and opposite to the sum of the leakage currents of diodes 12 and 14 by controlling the value of the drain-to-source current $I_{DS}$. Therefore, the gate leakage current $I_G$ can be effectively minimized when looking into the gate of the transistor.

The instant invention provides a circuit for setting up the proper biasing of the JFET such that the drain-to-source current $I_{DS}$ is at the proper value to forward bias diode 10 and cancel the individual leakage currents of the other diodes 12 and 14, thereby minimizing $I_G$. As noted above, in the prior art the gate leakage current is minimized by subtracting a current of magnitude equal to the gate leakage current from the gate node. In the present circuit the gate leakage current is minimized by controlling the drain-to-source current $I_{DS}$.

FIG. 3 discloses a simple embodiment of the instant invention for controlling the drain-to-source current $I_{DS}$. In particular, this circuit comprises a reference current generator means including an adjustable current source 18 placed in series with the source S of a primary JFET 20, whose gate leakage current is required to be minimized. In operation, the gate leakage current $I_G$ is monitored as the adjustable current source 18 is adjusted to provide drain-to-source current $I_{DS}$ for primary JFET 20. As the drain-to-source current $I_{DS}$ reaches a certain value $I_{DSM}$, as described in FIG. 1, the gate leakage current $I_G$ will be minimized. For integrated circuits, the current source 18 can be trimmed to remain at the critical $I_{DS}$ current $I_{DSM}$ by any of the well known prior art trimming techniques. More specifically, the adjustable current source 18 can be trimmed by laser trimming a resistor, blowing fuseable links, or a user-supplied trim pot.

It should be noted that once the minimum drain-to-source current $I_{DSM}$ is found such that diode 10 of FIG. 2 is forward-biased, the existence of any gate bias will have no effect on the minimization of gate leakage current since the source voltage will track the gate voltage. In particular, as $I_{DSM}$ is held constant, the gate-to-source voltage differential will remain constant to keep diode 10 forward-biased.

A second embodiment of the circuit of the instant invention is seen in FIG. 4. In particular, the reference current generator means of FIG. 3 is advantageously provided by a current source JFET 22 which acts as a current source for primary JFET 24, whose gate leakage current is required to be minimized. As seen in FIG. 4, the drain D of JFET 22 is connected to the source S of JFET 24, while the gate of JFET 22 is left floating. The source S of JFET 22 is connected to the supply voltage. Finally, the gate G of JFET 24 is connected to the voltage input while the drain D of this transistor is at ground potential.

Since the gate G of current source JFET 22 is left floating, the gate-to-source voltage of this transistor is negative and therefore the pn junction which forms the gate-to-source junction is forward-biased as required. The gate-to-source junction will then forward bias to an equilibrium value at which the resulting gate-to-source current $I_{GS}$ will exactly cancel the sum of the gate-to-drain and gate-to-substrate leakages, as described with reference to FIG. 2. As long as the gate G of current source JFET 22 is left floating, node 23 of this transistor, which corresponds to node 16 of FIG. 2, will remain at an equilibrium point such that gate leakage current can be minimized. The gate-to-source voltage of JFET 22 then serves to set the drain-to-source current $I_{DS}$ of current source JFET 22 to $I_{DSM}$, this current also being applied to the source S of primary JFET 24. If JFETs 22 and 24 are matched, then the drain-to-source current $I_{DS}$ of primary JFET 24 will be substantially equal to the drain-to-source current $I_{DS}$ of current source JFET 22. Since the $I_{DS}$ of current source JFET 22 has been chosen so as to minimize the gate leakage current $I_G$, the gate leakage current of primary JFET 24 will be minimized as well. It should be noted that transistors 22 and 24 will be essentially identical if formed on the same microchip. Therefore, $I_{DS}$ of JFET 22 will be substantially equal to $I_{DSM}$ of JFET 24 and the gate leakage current $I_G$ of primary JFET 24 will be effectively reduced.

FIG. 5 shows a more detailed embodiment of the basic circuit disclosed in FIG. 4 in conjunction with an operational amplifier 38. As discussed previously, an ideal operational amplifier should have infinite input impedance and zero input current. The requirement of infinite input impedance is typically achieved in practice by the use of a pair of matched JFETs in the input circuit of the operational amplifier. Referring now to FIG. 5, this matched input pair comprises p-channel primary JFETs 40 and 42 which have their source terminals S connected together at node 41 to form a differential amplifier. The positive and negative inputs to the amplifier are supplied via the gates G of the JFETs 40 and 42. The JFETs have an inherently high input impedance when biased linearly and therefore operational amplifier 38 has an extremely high input impedance.

The input or gate leakage current $I_G$ of primary JFETs 40 and 42 of the operational amplifier 38 can be minimized by the circuit seen in FIG. 5. In particular, the current source JFETs 48 and 50 form the reference current generator means for supplying a controlled value of drain-to-source current $I_{DS}$ to the primary JFETs 40 and 42, thereby minimizing the gate leakage currents at the inputs to operational amplifier 38. The current source JFETs 48 and 50 have their source terminals S connected together at node 49 to form a differential pair. The gates G of the current source JFETs 48 and 50 are left floating such that the gate-to-source voltages of JFETs 48 and 50 are negative. As described in FIGS. 2 and 4, the diodes which form the gate-to-source junctions of current source JFETs 48 and 50 will then be forward-biased such that the gate leakage currents of these JFETs can be minimized.

The reference current generator means including current source JFETs 48 and 50 thus derives a drain-to-source current $I_{DS1}$ which substantially cancels the gate leakage currents $I_G$ of these transistors. As described in FIG. 4, this drain-to-source current can also effectively minimize the gate leakage currents of the primary JFET input transistors 40 and 42 if these latter transistors are matched to the JFETs 48 and 50. As will be discussed below, the instant invention provides a current mirror means connected between the sources of the current source JFETs 48 and 50 and the sources of the primary JFETs 40 and 42 to effect the minimization of the gate leakage current of the primary JFETs by the use of the $I_{DS}$ of current source JFETs 48 and 50.

Referring again to FIG. 5, the drain-to-source current $I_{DS1}$ is applied to the input transistors 40 and 42 via a current mirror means comprising pnp transistors 52, 54, 56 and 58, and resistors 60 and 62. In a 1:1 current mirror, input current variations applied at the input thereof will cause output current variations equal and opposite thereto in the current mirror's output circuit. A typical current mirror includes a pair of matched transistors having similar base-emitter circuits biased in common by a negative feedback circuit coupling the collector electrode of the first transistor to its base electrode. This feedback circuit regulates the collector current of the first transistor to be substantially the same as the applied input current. Since the base-emitter circuits are biased in common, the collector currents of the transistors are substantially equal.

Referring to FIG. 5, the current mirror means comprises a first current mirror including transistors 52 and 54. As described above, the input current to the current mirror, which is supplied to the collector of transistor 52, is mirrored at the collector of transistor 54. It should be noted that the input current to the current mirror is the drain-to-source current $I_{DS1}$ for which the gate leakage currents of current source JFETs 48 and 50 are minimized. Therefore, since JFETs 40, 42, 48 and 50 are identical, the collector current of transistor 54, which is the drain-to-source current $I_{DS2}$ for the primary JFETs 40 and 42, serves to minimize the gate leakage current of the primary JFET input pair. The transistors 56 and 58 form a second current mirror, which in conjunction with identical emitter resistors 60 and 62, provide increased accuracy of the current mirror means. Note that if primary JFETs 40 and 42 aren't matched to current source JFETs 48 and 50, the current mirror means can be adjusted to provide a proportional output current by scaling resistors 60 and 62.

The other transistors seen in FIG. 5, specifically JFETs 64 and 66, npn transistors 68 and 70, and pnp transistors 72, 74, 76 and 78, are provided to keep the gate-to-drain voltages of current source JFETs 48 and 50 matched to the gate-to-drain voltage of the input primary JFETs 40 and 42 even though the input common mode voltage applied to the operational amplifier 38 varies.

Figure 6:
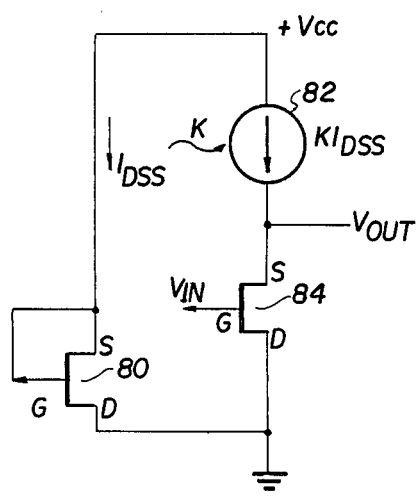
FIG. 6 shows another embodiment wherein a scaled reference source is utilized to minimize the gate leakage current of a primary JFET.

FIG. 6 discloses another embodiment of the instant invention wherein the reference current generator means is provided by an $I_{DSS}$ scaled reference source comprising a second JFET 80 and a current scaler means 82. The drain-to-source current $I_{DSS}$ is the value of $I_{DS}$ when the gate-to-source voltage is equal to zero. It should be noted that for a given JFET geometry made with a given manufacturing process, the value of $I_{DS}$ for which the gate leakage current $I_G$ becomes zero is some factor K of the $I_{DSS}$ value. Referring now to FIG. 6, the source S of the second JFET 80 is connected, through the current scaler means 82, to the source S of primary JFET 84, whose gate leakage current is to be minimized. The second JFET 80 is provided to generate the reference value of $I_{DSS}$. This is accomplished by shorting the gate terminal G of JFET 80 to its source terminals such that the gate-to-source voltage equals zero. The scaling factor K is a function of the given JFET geometry and manufacturing process and is provided by the current scaler means 82. Note that although FIG. 6 shows current scaler 82 being biased by the supply voltage, the actual scaler is controlled by $I_{DSS}$. Therefore, the output of the scaler 82 is $KI_{DSS}$, and this current is applied to the primary JFET 84. Since the primary JFET 84 is driven by this scaled value of $I_{DSS}$, its gate leakage current is effectively minimized.

The current scaler means 82 is advantageously a current mirror circuit as described in FIG. 5. In particular, the circuit of FIG. 6 can easily be incorporated into the operational amplifier of FIG. 5 by simply shorting the gates of the individual JFETs 48 and 50 to their respective source terminals and ratioing the resistors 60 and 62 such that the drain-to-source current $I_{DS}$ for primary JFETs 40 and 42 is a factor of K times the current $I_{DSS}$ of current source JFETs 48 and 50. Note that primary JFET's 40 and 42 correspond to primary JFET 84 in FIG. 6 and current source JFET's 48 and 50 correspond to second JFET 80.

It should therefore be recognized that the instant invention provides a novel circuit for reducing the gate leakage current of a single JFET or a pair of matched JFETs utilized as the input to an operational amplifier. In particular, this reduction is achieved by providing a reference current generator means which derives a reference drain-to-source current that when applied to the JFET, reduces its gate leakage current. This method has proven to be more efficient than the prior art wherein gate leakage is reduced by subtracting a current of magnitude equal to the gate leakge current from the gate node of the transistor.

From the preceding description of the preferred embodiments, it is evident that the objects of the invention are attained. Although the invention has been described and illustrated in detail, it is to be clearly understood that the same is by way of illustration and example only and is not to be taken by way of limitation. The spirit and scope of this invention are to be limited only by the terms of the appended claims.

What is claimed:

1. A transistor circuit, comprising:
a primary JFET having a gate, a drain, a source, and a gate leakage current; said drain being connected to a ground potential; and
a reference current generator means connected between a voltage supply and said source of said primary JFET for supplying to said source a current having a value which forces said gate leakage current to be reduced.

2. A transistor circuit as defined in claim 1 wherein said reference current generator means comprises an adjustable current source.

3. A transistor circuit as defined in claim 1 wherein said reference current generator means comprises a current source JFET, said current source JFET having a gate, a drain, and a source; said drain of said current source JFET being connected to said source of said primary JFET, and said source of said current source JFET being connected to said voltage supply.

4. A transistor circuit as defined in claim 3 wherein said primary JFET and said current source JFET are substantially identical transistors.

5. A transistor circuit as defined in claim 4 wherein said gate of said current source JFET is left floating such that the gate-to-source junction of said current source JFET is forward-biased.

6. A transistor circuit as defined in claim 1 wherein said reference current generator means comprises a current source JFET, said current source JFET having a gate, a drain, and a source; said source of said current source JFET being connected to said source of said primary JFET by a current mirror means and said drain of said current source JFET being connected to said ground potential.

7. A transistor circuit as defined in claim 6 wherein said current source JFET and said primary JFET are substantially identical transistors.

8. A transistor circuit as defined in claim 7 wherein said gate of said current source JFET is left floating such that the gate-to-source junction of said current source JFET is forward biased.

9. A transistor circuit as defined in claim 1 wherein said reference current generator means comprises a second JFET and a current scaler means, said second JFET having a gate, a drain, and a source; said source of said second JFET being connected to said voltage supply and to said source of said primary JFET through said current scaler means; said drain of said second JFET being connected to said ground potential.

10. A transistor circuit as defined in claim 9 wherein said gate of said second JFET is connected to said source of said second JFET such that the gate-to-source voltage of said second JFET equals zero.

11. A transistor circuit as defined in claim 10 wherein said current scaler means includes a means for multiplying current through said second JFET by a scale factor and applying this resulting scaled current to said source of said primary JFET to reduce said gate leakage current.

12. A transistor circuit as defined in claim 11 wherein said current scaler means is a current mirror means which includes a pair of resistors, said resistors being ratioed to a value equal to said scale factor.

* * * * *